(12) United States Patent
Martinez et al.

(10) Patent No.: US 8,676,536 B2
(45) Date of Patent: Mar. 18, 2014

(54) METHOD AND APPARATUS FOR SELECTING VOLTAGE AND FREQUENCY LEVELS FOR USE IN AT-SPEED TESTING

(75) Inventors: Jose M Martinez, Essex Junction, VT (US); Chandramouli Visweswariah, Yorktown Heights, NY (US); Francis Woytowich, Essex Junction, VT (US); Jinjun Xiong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 12/696,902

(22) Filed: Jan. 29, 2010

(65) Prior Publication Data

US 2011/0191055 A1    Aug. 4, 2011

(51) Int. Cl.
*G06F 17/18* (2006.01)
*G01R 31/00* (2006.01)

(52) U.S. Cl.
USPC ............ 702/179; 702/117; 702/180; 702/181

(58) Field of Classification Search
USPC .......................................... 702/117, 179–181
See application file for complete search history.

(56) References Cited

U.S. PATENT DOCUMENTS

| | | | |
|---|---|---|---|
| 7,363,176 B2 * | 4/2008 | Patel et al. ...................... | 702/64 |
| 7,539,893 B1 | 5/2009 | Ferguson | |
| 7,620,921 B2 | 11/2009 | Foreman et al. | |
| 7,873,925 B2 | 1/2011 | Visweswariah et al. | |
| 7,880,535 B2 * | 2/2011 | Inoue ............................ | 327/544 |
| 2003/0204349 A1 * | 10/2003 | Ando ............................. | 702/117 |
| 2008/0010032 A1 | 1/2008 | Sugiyama | |
| 2009/0119629 A1 | 5/2009 | Grise et al. | |
| 2009/0182522 A1 | 7/2009 | Visweswariah et al. | |

OTHER PUBLICATIONS

Gupta et al., "Simulation Based Multiobjective Schedule Optimization in Semiconductor Manufacturing," Winter 2002, pp. 1862-1870.*

* cited by examiner

*Primary Examiner* — Michael Nghiem
*Assistant Examiner* — Alexander Satanovsky
(74) *Attorney, Agent, or Firm* — Preston Young

(57) ABSTRACT

In one embodiment, the invention is a method and apparatus for selecting voltage and frequency levels for use in at-speed testing. One embodiment of a method for selecting a set of test conditions with which to test an integrated circuit chip includes formulating a statistical optimization problem and obtaining a solution to the statistical optimization problem, where the solution is the set of test conditions.

19 Claims, 3 Drawing Sheets

METHOD AND APPARATUS FOR SELECTING VOLTAGE AND FREQUENCY LEVELS FOR USE IN AT-SPEED TESTING

BACKGROUND OF THE INVENTION

The present invention relates generally to design automation, and relates more particularly to the at-speed structural test (ASST) of integrated circuit (IC) chips.

When IC chips come off the manufacturing line, the chips are tested "at-speed" to ensure that they perform correctly (and to filter out chips that do not perform correctly). In particular, the chips are tested at a specified voltage level ($V_{test}$). In addition, the chips must meet a specified frequency level ($F_{test}$) to be qualified as "good" chips.

The determination of $V_{test}$ and $F_{test}$ directly impacts the yield (i.e., the percentage of the chips that are shipped to customers) and the shipped product quality loss (i.e., the percentage of the chips that are shipped to customers that are "bad" chips). More stringent test conditions will improve shipped product quality loss but worsen yield. More relaxed test conditions will improve yield but worsen shipped product quality loss.

Conventionally, $V_{test}$ and $F_{test}$ are determined in a heuristic manner based on empirical hardware characterization. This approach is performed manually using engineering judgment. Thus, inherently, this approach has no mathematical formulation or statistical basis and requires significant human effort. The resulting test conditions are typically highly sensitive to variations in sample chips.

SUMMARY OF THE INVENTION

In one embodiment, the invention is a method and apparatus for selecting voltage and frequency levels for use in at-speed testing. One embodiment of a method for selecting a set of test conditions with which to test an integrated circuit chip includes formulating a statistical optimization problem and obtaining a solution to the statistical optimization problem, where the solution is the set of test conditions.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for selecting voltage and frequency levels for use in at-speed testing of IC chips. Embodiments of the invention provide an automated technique for determining the optimal voltage and frequency levels for testing a set of IC chips. The voltage and frequency levels are then applied by a tester (i.e., a system or device that electronically tests the IC chips under a set of test parameters in order to determine whether their operational characteristics match simulation models or other documentation for the IC chips). The present invention achieves better and more robust testing of IC chips, as well as higher productivity, than is possible with conventional heuristic practices.

Figure 1:
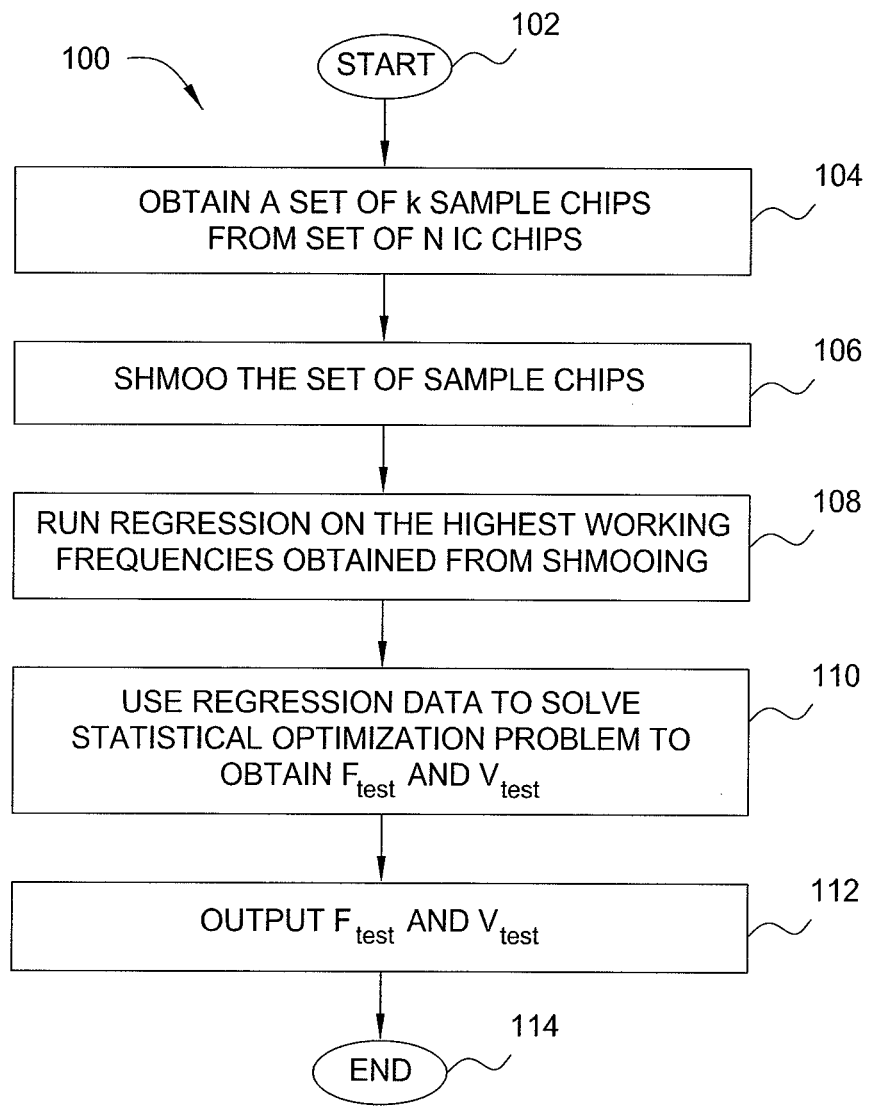
FIG. 1 is a flow diagram illustrating one embodiment of a method for selecting voltage and frequency levels for use in at-speed testing of a set of integrated circuit chips, according to the present invention.

FIG. 1 is a flow diagram illustrating one embodiment of a method 100 for selecting voltage and frequency levels for use in at-speed testing of a set of IC chips, according to the present invention. The method 100 may be implemented, for example, at a processor that is coupled to a tester for testing the set of IC chips. Alternatively, the method 100 may be implemented at the tester.

The method 100 is initialized at step 102 and proceeds to step 104, where the method 100 obtains a set of k sample chips from the set of N IC chips (where k≤N). The k sample chips can be selected randomly or selected over a set of parametric indicators (for example, over a range of performance-sensitive ring oscillator (PSRO) frequencies over the set of N IC chips).

In step 106, the method 100 shmoos (i.e., plots the response varying over a range of conditions and inputs) the set of sample chips. In one embodiment, shmooing involves, for each of the k sample chips, applying a set of voltages over some range of voltages. At each applied voltage, the frequency of the sample chip is varied until the sample chip fails. Thus, the highest working frequency (i.e., the highest operating frequency at which the sample chip does not fail) is obtained for each sample chip under different voltage levels.

Figure 2:
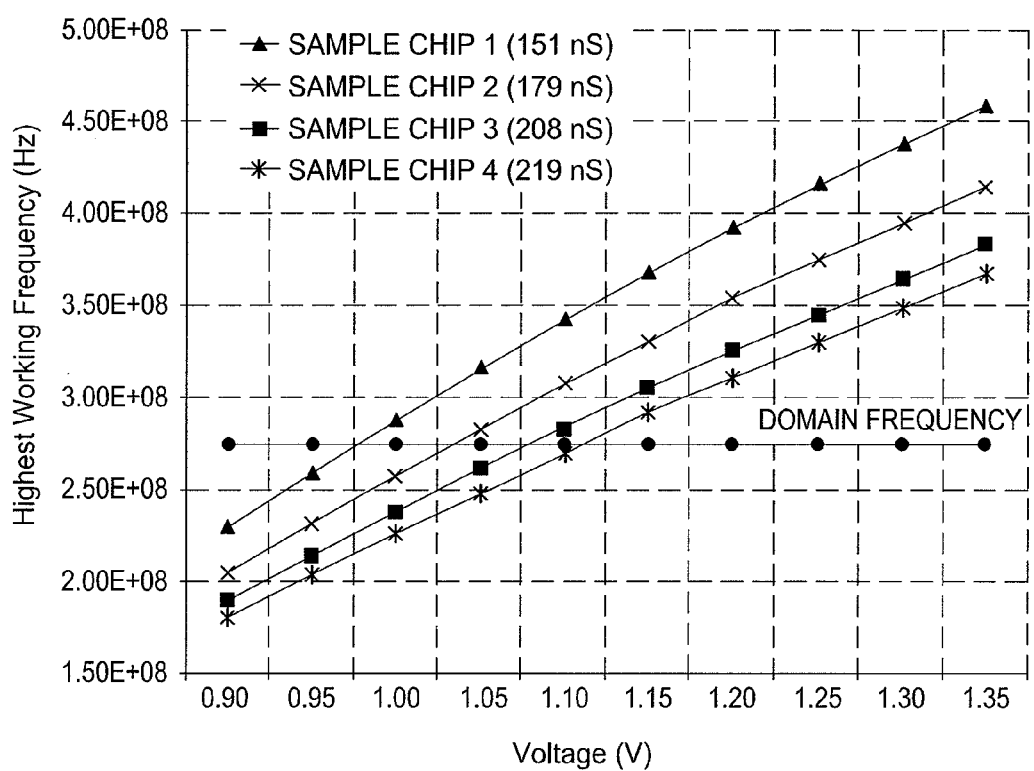
FIG. 2 is a graph illustrating voltage versus highest working frequency for a set of four sample chips.

FIG. 2, for example, is a graph illustrating voltage versus the highest working frequency, with the domain frequency (i.e., the frequency used by customers in normal operation) illustrated as a horizontal line for a set of four sample chips (designated as SAMPLE CHIP 1, SAMPLE CHIP 2, SAMPLE CHIP 3, and SAMPLE CHIP 4). The PSRO frequency for each sample chip is indicated in parentheses; as illustrated, the sample chips cover a range of PSRO frequencies from 151 nanoseconds to 219 nanoseconds. Each point on the graph designates, for a given sample chip, the highest working frequency at a corresponding voltage.

Referring back to FIG. 1, in step 108, the method 100 runs a regression on the highest working frequencies obtained in step 106. The result of the regression is a mathematical model that captures the relation between the working frequencies, the characteristics of the set of sample chips, and the different voltage levels.

In step 110, the method 100 uses the regression data to solve a statistical optimization problem. The solution to the optimization problem comprises the optimal testing conditions for the frequency and the voltage (i.e., $F_{test}$ and $V_{test}$). In particular, the optimization problem attempts to achieve a target scrap rate, $T_{scrap}$ (i.e., a percentage of the set of N IC chips that is scrapped during ASST) based on the mathematical model obtained in step 108. The scrap rate is typically used by test engineers as an indicator to judge the testing quality. When the scrap rate is too high, too many chips are discarded, and yield suffers. When the scrap rate is too low, too many chips are shipped to customers, and shipped product quality loss may be at risk of being high. In one embodiment, $T_{scrap}$ is in the range of 0.5 to 2.5 percent.

In one embodiment, the optimization problem seeks to select values for $F_{test}$ and $V_{test}$ that minimize the deviation from the target scrap rate. Thus, in one embodiment, the optimization problem is formulated as follows:

$$\min_{F_{test}, V_{test}} \|P(F(PSRO, V_{test}) \le F_{test}) - T_{scrap}\|$$

such that:

$$V_{min} \le V_{test} \le V_{max}$$

$$F_{min} \le F_{test} \le F_{max}$$

$$F(PSRO_k, V), k \in [1, N] \in [V_{min}, V_{max}] \quad \text{(EQN. 1)}$$

where PSRO is the PSRO frequency for all chips in the set of N IC chips, F(PSRO, V) is the modeled highest working frequency for all chips with different PSRO frequencies at any voltage level V, $F(PSRO_k, V)$ are the shmooed highest working frequencies for the set of k sample chips (e.g., in the case of FIG. 2, the k=4 slanted curves), $P(F(PSRO, V_{test}) \le F_{test})$ is the probability that the frequency for all chips in the set of N IC chips as a function of PSRO frequency and test voltage $V_{test}$ is less than or equal to the test frequency $F_{test}$, $V_{min}$ and $V_{max}$ are the minimum and maximum allowable voltage levels, respectively, and $F_{min}$ and $F_{max}$ are the minimum and maximum achievable frequencies in the tester, respectively.

The modeled F(PSRO, V) in the statistical optimization problem defined in EQN. 1 comprises a known (analytical) part and an unknown part. The known part has a given functional form, while the unknown part is modeled as one or more random variables. In one embodiment, the unknown part of the optimization problem is modeled as a random variable that represents variation. For example, F(PSRO, V) may be modeled as follows:

$$F(PSRO, V) = G(PSRO, V) + \Delta R \quad \text{(EQN. 2)}$$

where R is the random variable.

The known part of F(PSRO, V) can be any user-selected functional form based on engineering knowledge about the process. For example, the known part of the optimization problem can be modeled as:

$$G(PSRO, V) = \alpha_0 + (\alpha_1 \cdot PSRO) + (\alpha_2 \cdot V) \quad \text{(EQN. 3)}$$

where the frequency F is a linear function of the voltage V and the PSRO frequency.

The regression performed in step 108 provides the known part of F(PSRO, V), based on the shmoo data. The remaining error or uncertainty is assigned to the unknown random variable.

In one embodiment, the PSRO frequency can be modeled as a distribution. In another embodiment, the random variation $\Delta R$ can be adjusted to make the model more comfortably capture model uncertainty. This adjustment can be based on the sample chip data and/or on expert or domain knowledge.

For example, referring back to EQN. 1 by assuming Gaussian random distributions for both PSRO and $\Delta R$, EQN. 1 could be alternatively formulated as:

$$\min_{F_{test}, V_{test}} \|\Phi(PSRO, \Delta R | V_{test}, F_{test}) - T_{scrap}\| \quad \text{(EQN. 4)}$$

More specifically, solving EQN. 1 based on a linear regression model, one can obtain:

$$F(PSRO, V) = G(PSRO, V) + \Delta R \quad \text{(EQN. 5)}$$
$$= \alpha_0 + (\alpha_1 \cdot PSRO) + (\alpha_2 \cdot V) + \Delta R$$

Thus, $$P(F(PSRO, V_{test}) \le F_{test}) = \Phi\left(\frac{F_{test} - \mu_F}{\sigma_F}\right) \quad \text{(EQN. 6)}$$

$$= \Phi\left(\frac{F_{test} - \alpha_0 - (\alpha_1 \cdot \mu_{PSRO}) + (\alpha_2 \cdot V_{test}) - \mu_{\Delta R}}{\sqrt{(\alpha_1^2 \cdot \sigma_{PSRO}^2) + \sigma_{\Delta R}^2}}\right)$$

$$= T_{scrap}$$

And, $$\Phi^{-1}(T_{scrap}) = \frac{F_{test} - \alpha_0 - (\alpha_1 \cdot \mu_{PSRO}) + (\alpha_2 \cdot V_{test}) - \mu_{\Delta R}}{\sqrt{(\alpha_1^2 \cdot \sigma_{PSRO}^2) + \sigma_{\Delta R}^2}} \quad \text{(EQN. 7)}$$

For the same target scrap rate, one can have multiple choices of $V_{test}$ and $F_{test}$ within a valid region. These choices fall within a straight line bounded by $[V_{min}, V_{max}]$ and $[F_{min}, F_{max}]$. In one embodiment, $F_{min}$ is chosen as $F_{domain}$. Thus, $F_{test}$ can be solved as:

$$F_{test} = \alpha_2 \cdot V_{test} + \alpha_0 + (\alpha_1 \cdot \mu_{PSRO}) + \quad \text{(EQN. 8)}$$
$$\mu_{\Delta R} + \Phi^{-1}(T_{scrap}) \cdot \sqrt{(\alpha_1^2 \cdot \sigma_{PSRO}^2 + \sigma_{\Delta R}^2)}$$

The method 100 outputs the optimal testing conditions $F_{test}$ and $V_{test}$ in step 112. In one embodiment, the optimal testing conditions are output directly to the tester (e.g., by programming the tester), which applies the optimal testing conditions to testing of the set of IC chips. The method 100 then terminates in step 114.

The method 100 therefore provides a framework to systematically examine different effects on chosen testing conditions. Application of the method 100 produces high-quality testing results that are robust to sample variations. Moreover, the automated flow of the present invention enhanced the productivity of the testing.

In one embodiment, a more general formulation of EQN. 8 can be used to extend the present invention to IC chips having multiple clock domains. When there are multiple clock domains, each clock domain would have its own model:

$$\forall i \in [1, m]: F_i(PSRO, V) = \alpha_{i,0} + (\alpha_{i,1} \cdot PSRO) + (\alpha_{i,2} \cdot V) + \Delta R_i \quad \text{(EQN. 9)}$$

The final scrap rate should be a joint scrap rate for all clock domains, i.e.:

$$P(F_1(PSRO, V_{1,test}) \le F_{1,test}, \text{ or } \ldots, \text{ or } F_m(PSRO, V_{m,test}) \le F_{m,test}) \quad \text{(EQN. 10)}$$

The optimization problem can thus be similarly formulated as:

$$\min_{F_{i,test}, V_{i,test}} \left\| \begin{array}{c} P(F_1(PSRO, V_{1,test}) \le F_{1,test}, \text{ or } \ldots, \\ \text{or } F_m(PSRO, V_{m,test}) \le F_{m,test}) - T_{scrap} \end{array} \right\|$$

such that $$\forall i \in [1, m]$$

$$V_{min} \le V_{i,test} \le V_{max}$$

$$F_{i,min} \le F_{i,test} \le F_{max} \quad \text{(EQN. 11)}$$

EQN. 11 can be solved numerically, such that the optimal solution is not unique and may not necessarily form a hyper plane. Alternatively, EQN. 11 can be solved iteratively. In the latter case, the test conditions for each clock domain are independently found to target an adjusted scrap rate that is lower than the target scrap rate. The same procedures described above with respect to FIG. 1 are followed for each clock domain. The joint scrap rate is then computed to determine what joint scrap rate can be finally achieved (e.g., using EQN. 10). If the joint scrap rate is higher than the target scrap rate, the adjusted scrap rate is reduced; if the joint scrap rate is lower than the target scrap rate, the adjusted scrap rate is increased.

The present invention therefore makes use of all shmoo data generated from a set of sample chips. The end result is thus less sensitive to one particular sample chip. In addition, by statistically targeting the "desired" scrap rate directly, the chances of over-scrapping or under-scrapping can be minimized.

Figure 3:
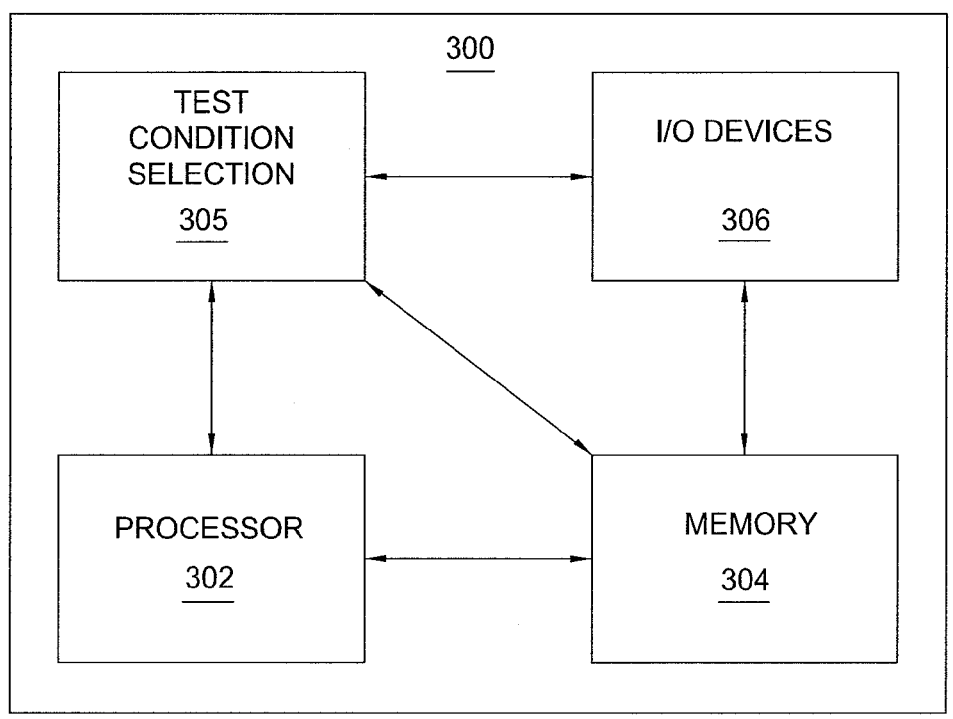
FIG. 3 is a high-level block diagram of test condition selection method that is implemented using a general purpose computing device.

FIG. 3 is a high-level block diagram of test condition selection method that is implemented using a general purpose computing device 300. In one embodiment, a general purpose computing device 300 comprises a processor 302, a memory 304, a test condition selection module 305 and various input/output (I/O) devices 306 such as a display, a keyboard, a mouse, a stylus, a wireless network access card, and the like. In one embodiment, at least one I/O device is a storage device (e.g., a disk drive, an optical disk drive, a floppy disk drive, a path selection tool, and/or a test pattern generation tool). It should be understood that the test condition selection module 305 can be implemented as a physical device or subsystem that is coupled to a processor through a communication channel.

Alternatively, the test condition selection module 305 can be represented by one or more software applications (or even a combination of software and hardware, e.g., using Application Specific Integrated Circuits (ASIC)), where the software is loaded from a storage medium (e.g., I/O devices 306) and operated by the processor 302 in the memory 304 of the general purpose computing device 300. Thus, in one embodiment, the test condition selection module 305 for selecting a voltage and frequency levels for use in at-speed structural testing of an IC chip, as described herein with reference to the preceding Figures, can be stored on a non-transitory computer readable storage medium (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A non-transitory computer readable medium containing an executable program for selecting a set of test conditions with which to test an integrated circuit chip, where the program performs steps of:
   formulating a statistical optimization problem, wherein the statistical optimization problem seeks to minimize deviation from a target scrap rate for a set of chips including the integrated circuit chip, wherein the target scrap rate defines a target percentage of the set of chips that is scrapped during at speed structural testing of the set of chips; and
   obtaining a solution to the statistical optimization problem, the solution comprising the set of test conditions.

2. The non-transitory computer readable medium of claim 1, wherein the set of test conditions comprises: a test voltage and a test frequency.

3. The non-transitory computer readable medium of claim 1, wherein a highest working frequency model for all chips in a set of chips including the integrated circuit chip comprises:
   a known part; and
   an unknown part.

4. The non-transitory computer readable medium of claim 3, wherein the unknown part is modeled as one or more random variables.

5. The non-transitory computer readable medium of claim 3, wherein the known part is solved using a mathematical model that describes a set of sample chips, where the set of sample chips is selected from a set of chips including the integrated circuit chip.

6. The non-transitory computer readable medium of claim 5, wherein the mathematical model is obtained by:
   shmooing the set of sample chips; and
   running a regression on results of the shmooing.

7. The non-transitory computer readable medium of claim 6, wherein the shmooing comprises:
   defining a set of voltages;
   obtaining a highest working frequency at each voltage in the set of voltages, for each sample chip in the set of sample chips.

8. Apparatus for selecting a set of test conditions with which to test an integrated circuit chip, the apparatus comprising:
   means for formulating a statistical optimization problem, wherein the statistical optimization problem seeks to minimize deviation from a target scrap rate for a set of chips including the integrated circuit chip, wherein the target scrap rate defines a target percentage of the set of chips that is scrapped during at speed structural testing of the set of chips; and
   means for obtaining a solution to the statistical optimization problem, the solution comprising the set of test conditions.

9. Method for selecting a set of test conditions with which to test an integrated circuit chip, the method comprising:
   formulating a statistical optimization problem, wherein the statistical optimization problem seeks to minimize deviation from a target scrap rate for a set of chips including the integrated circuit chip, wherein the target scrap rate defines a target percentage of the set of chips that is scrapped during at speed structural testing of the set of chips; and
   obtaining a solution to the statistical optimization problem, the solution comprising the set of test conditions,
   wherein at least one of the formulating and the obtaining is performed by a processor.

10. The method of claim 9, wherein the set of test conditions is uniform for all chips in the set of chips.

11. The method of claim 9, wherein the set of test conditions comprises: a test voltage and a test frequency.

12. The method of claim 9, wherein a highest working frequency model for all chips in a set of chips including the integrated circuit chip comprises:
 a known part; and
 an unknown part.

13. The method of claim 12, wherein the unknown part is modeled as one or more random variables.

14. The method of claim 12, further comprising:
 outputting, by the processor, the set of test conditions to a tester; and
 programming the tester to apply the set of test conditions during testing of the integrated circuit chip.

15. The method of claim 12, wherein the processor is part of a tester that applies the set of test conditions during testing of the integrated circuit chip.

16. The method of claim 12, wherein the known part is solved using a mathematical model that describes a set of sample chips, where the set of sample chips is selected from a set of chips including the integrated circuit chip.

17. The method of claim 16, wherein the mathematical model describes, for each chip in the set of sample chips, a relationship between highest working frequency, voltage, and chip characteristics.

18. The method of claim 16, wherein the mathematical model is obtained by:
 shmooing the set of sample chips; and
 running a regression on results of the shmooing.

19. The method of claim 18, wherein the shmooing comprises:
 defining a set of voltages;
 obtaining a highest working frequency at each voltage in the set of voltages, for each sample chip in the set of sample chips.

* * * * *